United States Patent
Kliger et al.

(10) Patent No.: US 9,124,477 B2
(45) Date of Patent: Sep. 1, 2015

(54) FREQUENCY INTERLEAVE WITHIN COMMUNICATION SYSTEMS

(71) Applicant: BROADCOM CORPORATION, Irvine, CA (US)

(72) Inventors: Avraham Kliger, Ramat Gan (IL); Tak Kwan Lee, Irvine, CA (US); Richard Stephen Prodan, Niwot, CO (US); Ba-Zhong Shen, Irvine, CA (US); Yitshak Ohana, Givat Zeev (IL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/471,301

(22) Filed: Aug. 28, 2014

(65) Prior Publication Data

US 2015/0063484 A1 Mar. 5, 2015

Related U.S. Application Data

(60) Provisional application No. 61/871,293, filed on Aug. 28, 2013, provisional application No. 62/033,979, filed on Aug. 6, 2014.

(51) Int. Cl.

| | |
|---|---|
| *H04K 1/10* | (2006.01) |
| *H04L 27/28* | (2006.01) |
| *H04L 27/26* | (2006.01) |
| *H04L 1/00* | (2006.01) |
| *H03M 13/27* | (2006.01) |
| *H03M 13/09* | (2006.01) |
| *H03M 13/11* | (2006.01) |
| *H03M 13/15* | (2006.01) |
| *H03M 13/23* | (2006.01) |
| *H03M 13/25* | (2006.01) |
| *H03M 13/29* | (2006.01) |

(52) U.S. Cl.
CPC ......... *H04L 27/2627* (2013.01); *H03M 13/271* (2013.01); *H03M 13/2707* (2013.01); *H03M 13/2789* (2013.01); *H04L 1/0042* (2013.01); *H03M 13/09* (2013.01); *H03M 13/1102* (2013.01); *H03M 13/152* (2013.01); *H03M 13/1515* (2013.01); *H03M 13/23* (2013.01); *H03M 13/258* (2013.01); *H03M 13/2957* (2013.01)

(58) Field of Classification Search
CPC .......... H03M 13/2739; H03M 13/275; H03M 13/2775
USPC ......................................... 375/260, 267, 295
See application file for complete search history.

(56) References Cited

U.S. PATENT DOCUMENTS

| | | | | |
|---|---|---|---|---|
| 7,589,993 | B2 * | 9/2009 | Yamaoka et al. | ............. 365/154 |
| 7,756,004 | B2 * | 7/2010 | Ouyang et al. | ................ 370/208 |

(Continued)

*Primary Examiner* — Freshten N Aghdam
(74) *Attorney, Agent, or Firm* — Garlick & Markison; Shayne X. Short

(57) ABSTRACT

A communication device includes a communication interface and a processor. In one example, the processor generates an orthogonal frequency division multiplexing (OFDM) symbol that includes information modulated within sub-carriers and then interleaves the sub-carriers of the OFDM symbol to generate an interleaved OFDM symbol. This interleaving of the sub-carriers operates to write the plurality of sub-carriers to rows of a two dimensional (2D) array and read the plurality of sub-carriers from columns of the 2D array. This interleaving also operates to read a column of the columns using a bit-reversed address of the column when the bit-reversed address is less than a number of the columns and using the address of the column when the bit-reversed address is greater than or equal to the number of the columns. The processor transmits, via the communication interface, the interleaved OFDM symbol to another communication device.

20 Claims, 8 Drawing Sheets

(56) References Cited

U.S. PATENT DOCUMENTS

| | | | |
|---|---|---|---|
| 2007/0064831 A1* | 3/2007 | Bjerke et al. | 375/267 |
| 2008/0002782 A1* | 1/2008 | Niu et al. | 375/295 |
| 2008/0225965 A1* | 9/2008 | Pi et al. | 375/260 |
| 2010/0064197 A1* | 3/2010 | Halter | 714/755 |
| 2010/0296603 A1* | 11/2010 | Lee et al. | 375/295 |
| 2012/0147988 A1* | 6/2012 | Neeman et al. | 375/295 |

* cited by examiner

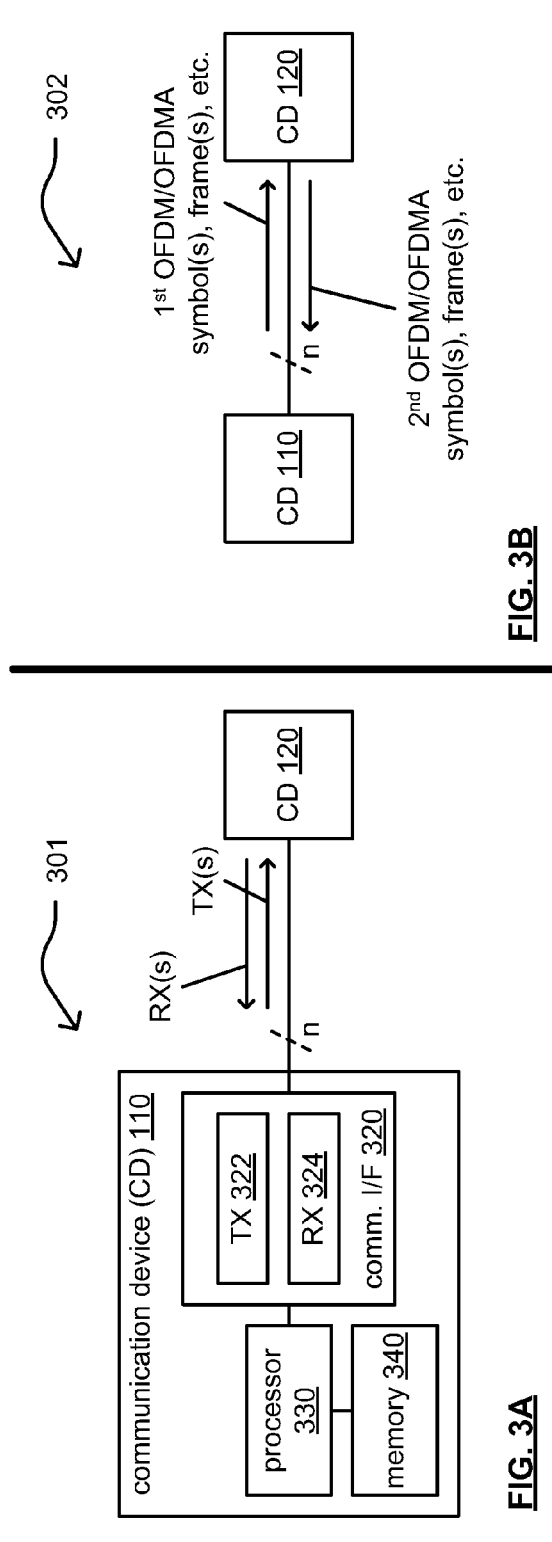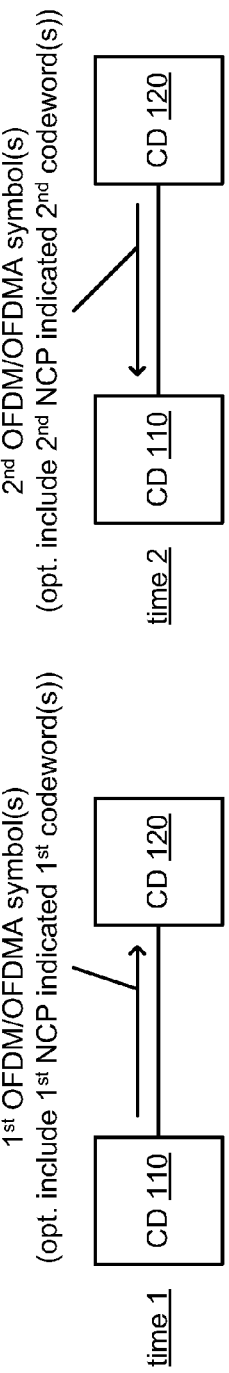

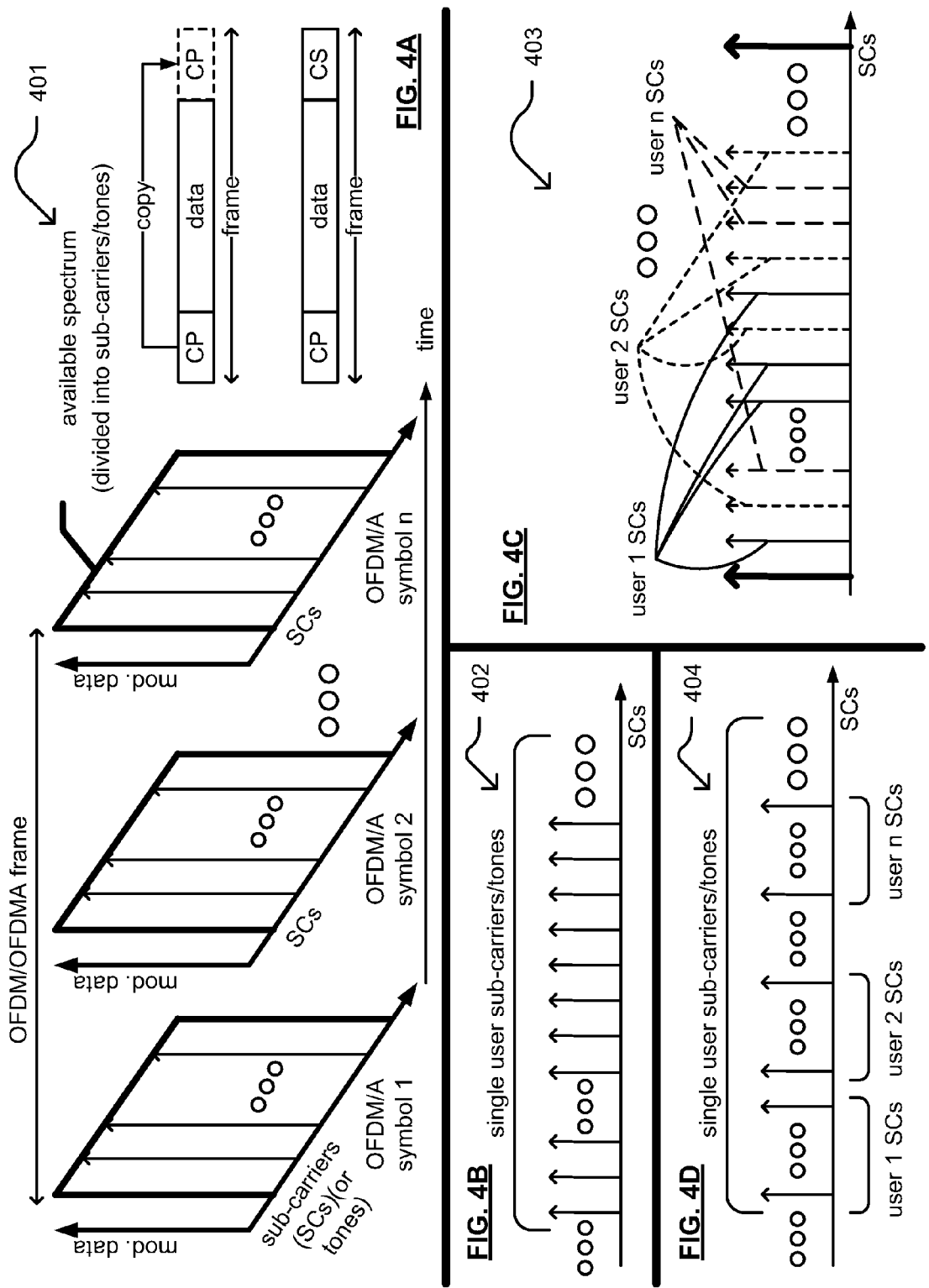

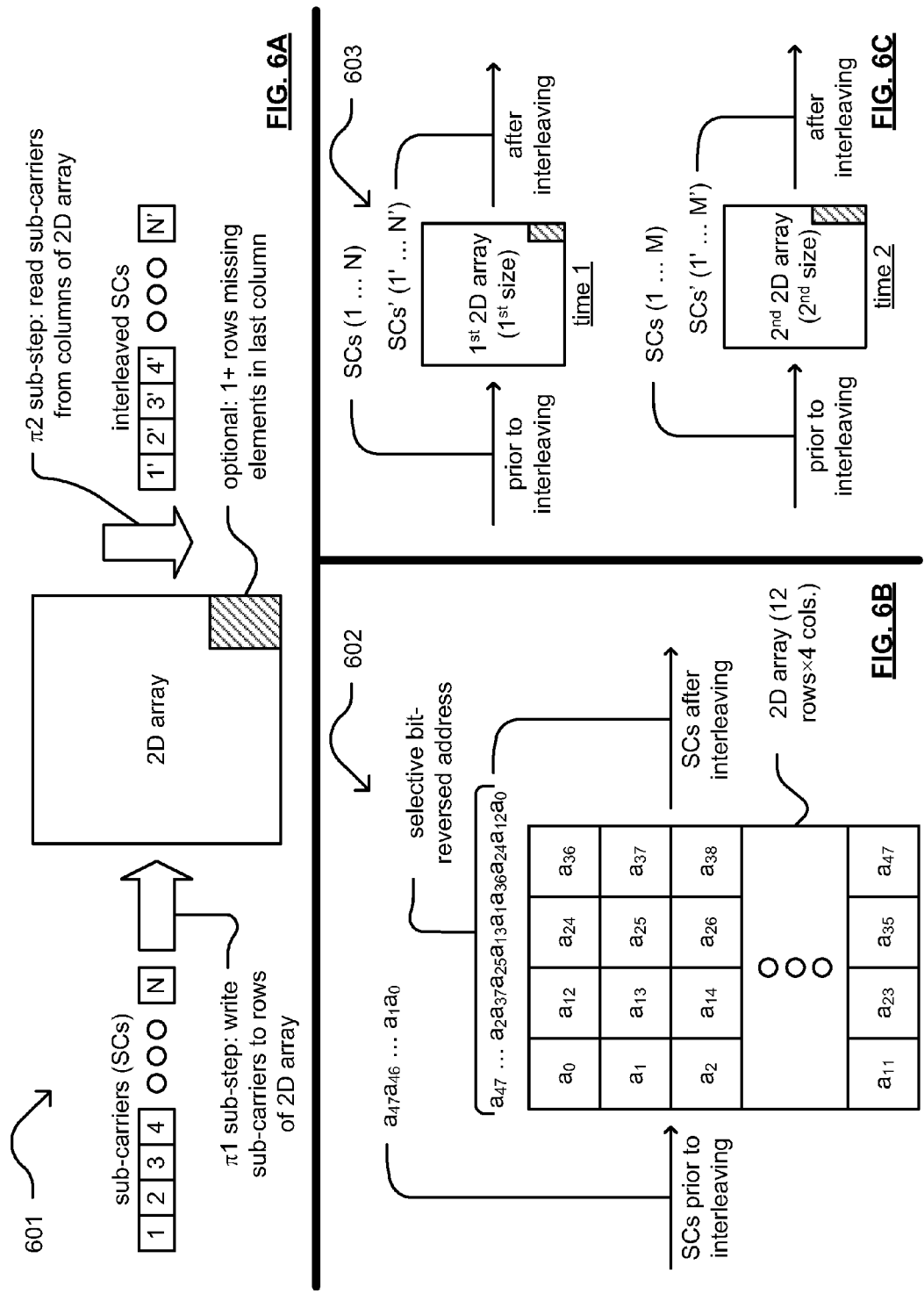

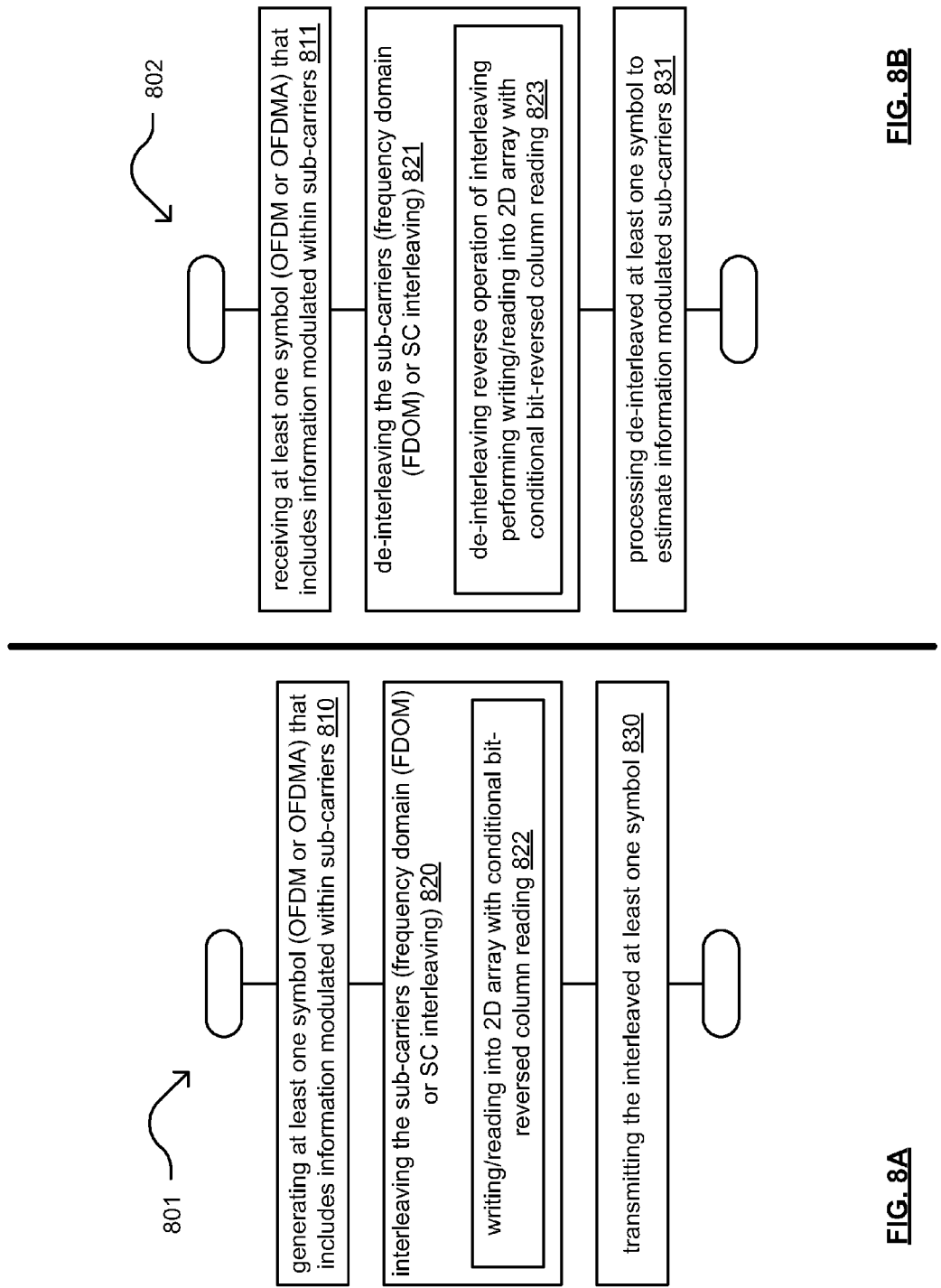

FREQUENCY INTERLEAVE WITHIN COMMUNICATION SYSTEMS

CROSS REFERENCE TO RELATED PATENTS/PATENT APPLICATIONS

The present U.S. Utility patent application claims priority pursuant to 35 U.S.C. §119(e) to U.S. Provisional Application No. 61/871,293, entitled "Frequency interleave within communication systems," filed Aug. 28, 2013; and U.S. Provisional Application No. 62/033,979, entitled "Frequency interleave within communication systems," filed Aug. 6, 2014, both of which are hereby incorporated herein by reference in their entirety and made part of the present U.S. Utility patent application for all purposes.

BACKGROUND

1. Technical Field

The present disclosure relates generally to communication systems; and, more particularly, to interleaving within such communication systems.

2. Description of Related Art

Data communication systems have been under continual development for many years. The primary goal within such communication systems is to transmit information successfully between devices. Unfortunately, many things can deleteriously affect signals transmitted within such systems resulting in degradation of or even complete failure of communication. Examples of adverse effects include interference and noise that may be caused by various sources including other communications, low-quality links, degraded or corrupted interfaces and connectors, etc.

Some communication systems use forward error correction (FEC) coding and/or error correction code (ECC) coding to increase the amount of information that may be transmitted between devices. When a signal incurs one or more errors during transmission, a receiver device can employ the FEC or ECC coding to try to correct those one or more errors. In addition, some communication systems use certain types of interleaving and/or deinterleaving to attempt to minimize the impact of a noise event on a transmission. There are a variety of types of interleaving and/or deinterleaving in prior art system yet there continues to be room for improvement to implement various forms of interleaving and/or deinterleaving.

A continual and primary directive in this area of development has been to try continually to lower the SNR required to achieve a given bit error ratio (BER) or symbol error ratio (SER) within a communication system. The Shannon limit is the theoretical bound for channel capacity for a given modulation and code rate. The ideal goal has been to try to reach Shannon's channel capacity limit in a communication channel. Shannon's limit may be viewed as being the data rate per unit of bandwidth (i.e., spectral efficiency) to be used in a communication channel, having a particular signal to noise ratio (SNR), where transmission through the communication channel with arbitrarily low BER or SER is achievable. There continues to be ample room for improvement in BER or SER performance including that which may be achieved with improved and better implementations of interleaving and/or deinterleaving

BRIEF DESCRIPTION OF THE SEVERAL VIEWS OF THE DRAWINGS

FIG. 3A is a diagram illustrating a communication device operative within one or more communication systems.

FIG. 3B is a diagram illustrating an example of operation of a communication device within one or more communication systems.

FIG. 3C is a diagram illustrating another example of operation of a communication device within one or more communication systems.

FIG. 4A is a diagram illustrating an example of orthogonal frequency division multiplexing (OFDM) and/or orthogonal frequency division multiple access (OFDMA).

FIG. 4B is a diagram illustrating another example of OFDM and/or OFDMA.

FIG. 4C is a diagram illustrating another example of OFDM and/or OFDMA.

FIG. 4D is a diagram illustrating another example of OFDM and/or OFDMA

FIG. 6A is a diagram illustrating an example of a two dimensional (2D) array used for interleaving of OFDM sub-carriers.

FIG. 6B is a diagram illustrating another example of a 2D array used for interleaving of OFDM sub-carriers.

FIG. 6C is a diagram illustrating an example of different 2D arrays used at different times for interleaving of OFDM sub-carriers.

FIG. 8A is a diagram illustrating an embodiment of a method for execution by one or more communication devices.

FIG. 8B is a diagram illustrating another embodiment of a method for execution by one or more communication devices.

DETAILED DESCRIPTION

Figure 1:
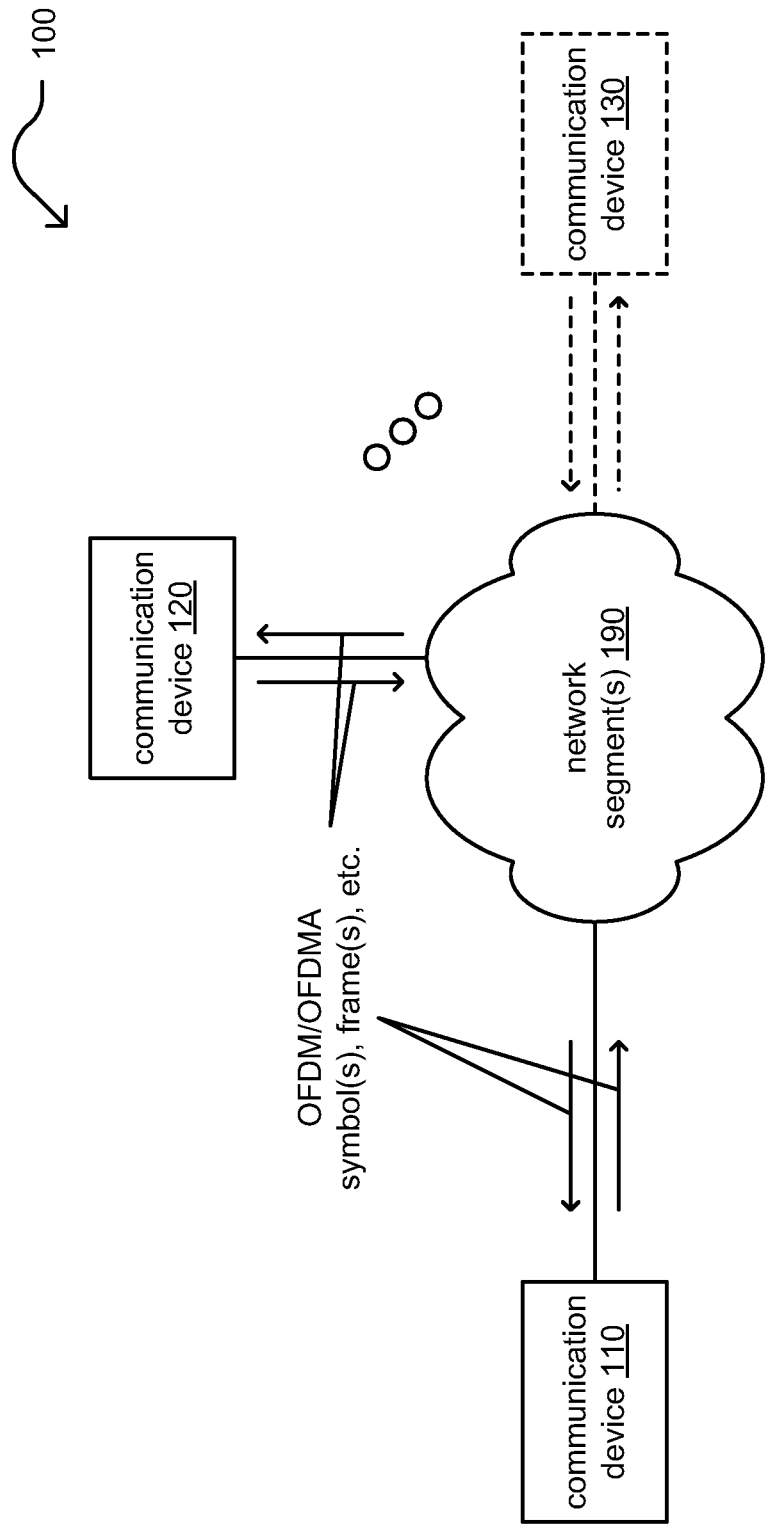
FIG. 1 is a diagram illustrating an embodiment of one or more communication systems.

FIG. 1 is a diagram illustrating an embodiment 100 of one or more communication systems. One or more network segments 190 provide communication inter-connectivity for at least two communication devices 110 and 120 (also referred to as CDs in certain locations in the diagrams). Note that general reference to a communication device may be made generally herein using the term 'device' (e.g., device 110 or CD 110 when referring to communication device 110, or devices 110 and 120, or CDs 110 and 120, when referring to communication devices 110 and 120). Generally speaking, any desired number of communication devices are included within one or more communication systems (e.g., as shown by communication device 130).

The various communication links within the one or more network segments 190 may be implemented using any of a variety of communication media including communication links implemented as wireless, wired, optical, satellite, microwave, and/or any combination thereof, etc. communication links. Also, in some instances, communication links of different types may cooperatively form a connection pathway between any two communication devices. Considering one possible example, a communication pathway between devices 110 and 120 may include some segments of wired communication links and other segments of optical communication links. Note also that the devices 110-130 may be of a variety of types of devices including stationary devices, mobile devices, portable devices, etc. and may support communications for any of a number of services or service flows including data, telephony, television, Internet, media, synchronization, etc.

In an example of operation, device 110 includes a communication interface to support communications with one or more of the other devices 120-130. This communication may be bidirectional/to and from the one or more of the other devices 120-130 or unidirectional (or primarily unidirectional) from the one or more of the other devices 120-130.

In one example, device 110 device includes a communication interface and a processor. The processor generates an orthogonal frequency division multiplexing (OFDM) symbol that includes information modulated within sub-carriers and then interleaves the sub-carriers of the OFDM symbol to generate an interleaved OFDM symbol. This interleaving may be viewed as being performed within the frequency domain (FDOM) (e.g., such that sub-carrier arrangement may be viewed as being a rearrangement of information in terms of bandwidth, frequency, etc.). This interleaving of the sub-carriers operates to write the plurality of sub-carriers to rows of a two dimensional (2D) array and read the plurality of sub-carriers from columns of the 2D array (or vice versa in an alternative implementation with write to columns and read from rows). This interleaving also operates to read a column of the columns, for all columns excluding a last column of the 2D array, using a bit-reversed address of the column when the bit-reversed address is less than a number of the columns and using the address of the column when the bit-reversed address is greater than or equal to the number of the columns. The processor transmits, via the communication interface, the interleaved OFDM symbol to another communication device. In some examples, the processor generates an OFDM frame that includes one or more OFDM symbols. Note also that alternative examples may generate an interleaved orthogonal frequency division multiple access (OFDMA) symbol and/or OFDMA frame using the principles presented in this disclosure. OFDM and OFDMA are also described in further detail below.

In another example, device 110 interleaves other sub-carriers of anther OFDM symbol to generate another interleaved OFDM symbol including operating to write the other sub-carriers to rows of another 2D array and read the other sub-carriers from columns of the other 2D array (or vice versa in an alternative implementation with write to columns and read from rows). This other 2D array can include a different number of rows and/or columns as the first/original 2D array. Alternatively, other 2D array can include a same number of rows and a different number of columns as the first/original 2D array.

In yet another example of such interleaving, device 110 is configured write the sub-carriers to rows of the 2D array consecutively and row by row and then to rotate a subset of columns of the 2D array that excludes a last column of the 2D array before reading the plurality of sub-carriers from the columns of the 2D array. Device 110 may perform one or more additional processes in conjunction with the interleaving of the sub-carriers.

Note that the information modulated within the sub-carriers may include any type of information (e.g., data, pilot office action training information such as for channel estimation, and/or any other type of information). In one example, the information modulated within the sub-carriers includes a Next Codeword Pointer (NCP) modulated within a first subset of the plurality of sub-carriers and data modulated within a second subset of the plurality of sub-carriers, wherein the NCP indicates beginning of a forward error correction (FEC) codeword within the OFDM symbol or another OFDM symbol. In another example, the information modulated within the sub-carriers includes two or more NCPs modulated within a first subset of the plurality of sub-carriers and data modulated within a second subset of the plurality of sub-carriers. In a specific implementation, the sub-carriers includes 4096 sub-carriers based on a 50 kHz carrier spacing or 8192 sub-carriers based on a 25 kHz carrier spacing, and the first subset of sub-carriers includes an integer number of 8 sub-carriers that are contiguously located within and beginning at a highest sub-carrier of the 4096 or 8192 sub-carriers.

Note also that such a device 110 may be any type of communication device including a cable headend transmitter or a cable modem termination system (CMTS), a cable modem, an optical communication device, a fiber-optic communication device, a satellite communication system, a wireless communication system, a wired communication system, and/or a mobile communication system.

Note also device 110 (or any other device) may not only be implemented to perform such operations to perform the reverse operations of generation of an OFDM symbol, interleaving of sub-carriers of the OFDM symbol, and transmission the interleaved OFDM symbol via the communication interface (e.g., including any appropriate digital to analog converter (DAC), modulation, scaling, frequency conversion, etc.), such as receiving of an interleaved OFDM symbol (e.g., including any appropriate analog to digital converter (ADC) operation, demodulation, scaling, frequency conversion, etc.), de-interleaving of sub-carriers of the interleaved OFDM symbol to generate a de-interleaved OFDM symbol, and processing of the de-interleaved OFDM symbol to extract information modulate within the sub-carriers of the de-interleaved OFDM symbol.

Figure 2:
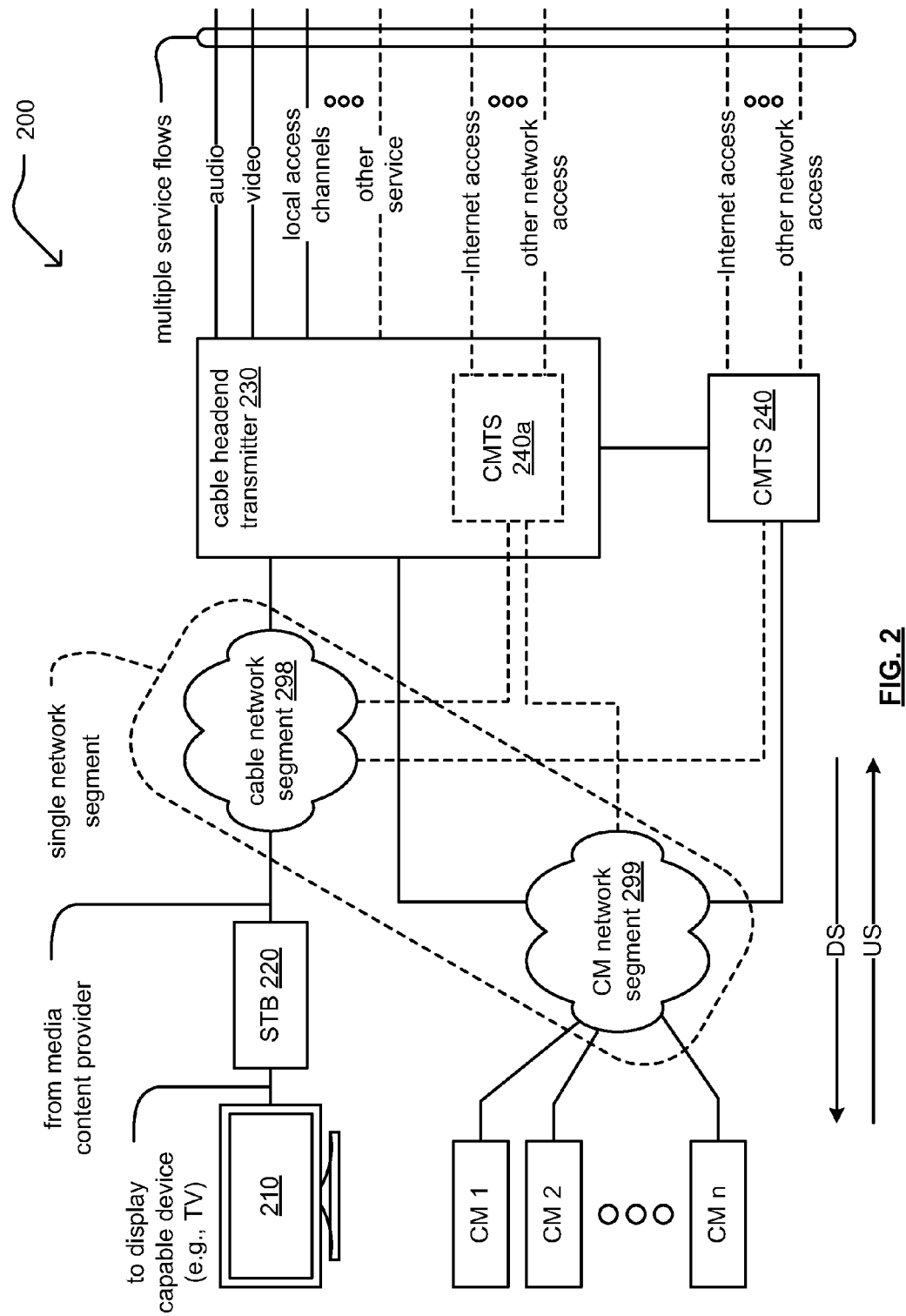
FIG. 2 is a diagram illustrating another embodiment of one or more communication systems.

FIG. 2 is a diagram illustrating another embodiment 200 of one or more communication systems. A cable headend transmitter 230 provides service to a set-top box (STB) 220 via cable network segment 298. The STB 220 provides output to a display capable device 210. The cable headend transmitter 230 can support any of a number of service flows such as audio, video, local access channels, as well as any other service of cable systems. For example, the cable headend transmitter 230 can provide media (e.g., video and/or audio) to the display capable device.

The cable headend transmitter 230 may provide operation of a cable modem termination system (CMTS) 240a. For example, the cable headend transmitter 230 may perform such CMTS functionality, or a CMTS may be implemented separately from the cable headend transmitter 230 (e.g., as shown by reference numeral 240). The CMTS 240 can provide network service (e.g., Internet, other network access, etc.) to any number of cable modems (shown as CM 1, CM 2, and up to CM n) via a cable modem (CM) network segment 299. The cable network segment 298 and the CM network segment 299 may be part of a common network or common networks. The cable modem network segment 299 couples the cable modems 1-n to the CMTS (shown as 240 or 240a). Such a cable system (e.g., cable network segment 298 and/or CM network segment 299) may generally be referred to as a cable plant and may be implemented, at least in part, as a hybrid fiber-coaxial (HFC) network (e.g., including various wired and/or optical fiber communication segments, light sources, light or photo detection components, etc.).

A CMTS 240 (or 240*a*) is a component that exchanges digital signals with cable modems 1-n on the cable modem network segment 299. Each of the cable modems is coupled to the cable modem network segment 299, and a number of elements may be included within the cable modem network segment 299. For example, routers, splitters, couplers, relays, and amplifiers may be contained within the cable modem network segment 299. Generally speaking, downstream information may be viewed as that which flows from the CMTS 240 to the connected cable modems (e.g., CM 1, CM2, etc.), and upstream information is that which flows from the cable modems to the CMTS 240.

Any one of the devices in embodiment 200 (e.g., CMs 1-n, cable headend transmitter 230, CMTS 240*a*, and/or CMTS 240) may include functionality to generate and process signals using the type of signaling (e.g., OFDM and/or OFDMA) and the types of processing (e.g., including interleaving and/or de-interleaving) as described herein with respect to sub-carriers.

For example, any one of the devices in embodiment 200 may include a communication interface to support communications with any of the other devices and also include a processor to generate various signals for transmission to any of the other devices and to process various other signals received from any of the other devices.

In an example of operation, CMTS 240 includes a communication interface and a processor. In another example of operation, CM 1 includes a communication interface and a processor. Generally, any one of the devices in embodiment 200 may be implemented to include a communication interface and a processor. In an example of operation, regardless of what specific device is being considered, a processor therein generates an orthogonal frequency division multiplexing (OFDM) symbol that includes information modulated within sub-carriers and then interleaves the sub-carriers of the OFDM symbol to generate an interleaved OFDM symbol. This interleaving processing can operate using the selective or conditional bit-reversed addressing as described herein such as when reading from columns of a 2D array used for the interleaving processing. The processor transmits, via the communication interface, the interleaved OFDM symbol to another communication device. Again, OFDM and/or OFDMA signaling may be used in various implementations as may be desired.

FIG. 3A is a diagram 301 illustrating a communication device (CD) 110 operative within one or more communication systems. The device 110 includes a communication interface 320 and a processor 330. The communication interface 320 includes functionality of a transmitter 322 and a receiver 324 to support communications with one or more other devices within a communication system. The device 110 may also include memory 340 to store information including one or more signals generated by the device 110 or such information received from other devices (e.g., device 120) via one or more communication channels. Memory 340 may also include and store various operational instructions for use by the processor 330 in regards to the processing of messages and/or other received signals and generation of other messages and/or other signals including those described herein. The communication interface 320 supports communications to and from one or more other devices (e.g., CD 120 and/or other communication devices). Operation of the communication interface 320 may be directed by the processor 330 such that processor 330 transmits and receives signals (TX(s) and RX(s)) via the communication interface 320.

Generally speaking, device 110 transmits one or more signals to device 120 (and/or any other device), and device 110 receives one or more other signals from device 120 (and/or any other device). In an example of operation, processor 330 generates an OFDM symbol that includes information modulated within sub-carriers and then interleaves the sub-carriers of the OFDM symbol to generate an interleaved OFDM symbol. The processor 330 also transmits, via the communication interface 320, the interleaved OFDM symbol to another communication device (e.g., device 120 and/or any other device). Again, OFDM and/or OFDMA signaling may be used in various implementations as may be desired.

FIG. 3B is a diagram illustrating an example 302 of operation of a communication device within one or more communication systems. In this example, device 110 supports communications to and from one or more other devices, such as device 120. In this example 302, device 110 transmits one or more OFDM symbols and/or OFDMA symbols (and/or OFDM frames and/or OFDMA frames) to device 120 (and/or any other device), and device 110 receives another one or more OFDM symbols and/or OFDMA symbols (and/or OFDM frames and/or OFDMA frames) from device 120 (and/or any other device). Note that these transmissions between the devices 110 and 120 may be made simultaneously, partially at the same time (e.g., offset from one another in time, etc.), or at separate times.

FIG. 3C is a diagram illustrating another example 303 of operation of a communication device within one or more communication systems. This diagram shows communications being made at different times between devices 110 and 120. At or during a first time (time 1), device 110 generates and transmits an interleaved OFDM symbol to device 120. At or during a second time (time 2), device 120 generates and transmits another interleaved OFDM symbol to device 110.

Any type of data may be modulated and included in the sub-carriers of an OFDM symbol generated by device 110 and/or 120. For example, this information may include Next Codeword Pointer (NCP) information, data (e.g., including forward error correction (FEC) and/or error correction code (ECC) generated codewords), and/or any other type(s) of information may be included within such an OFDM symbol. Various details are also provided below regarding NCP related information. NCP related information may be included within a relatively small subset of the total number of sub-carriers of the OFDM symbol (e.g., NCP information in only 8, 16, 24, etc. sub-carriers of a total number of 4096, 8192, etc. sub-carriers of the OFDM symbol). In certain instances, the interleaving processing described in this disclosure may be applied to any instance in which certain information is included on a relatively small number (e.g., a narrow set) of sub-carriers relative to a total number of sub-carriers of an OFDM symbol. The interleaving processing described in this disclosure can be applied to increase the robustness of interleaving. For example, this interleaving processing can ensure that information that is included within a relatively small number (e.g., a narrow set) of sub-carriers relative to a total number of sub-carriers of an OFDM symbol to increase the robustness of interleaving for sub-carriers including those included within the relatively small number (e.g., a narrow set) of sub-carriers.

FIG. 4A is a diagram illustrating an example 401 of orthogonal frequency division multiplexing (OFDM) and/or orthogonal frequency division multiple access (OFDMA). OFDM's modulation may be viewed as dividing up an available spectrum into a plurality of narrowband sub-carriers (e.g., relatively lower data rate carriers). The sub-carriers are included within an available frequency spectrum portion or band. This available frequency spectrum is divided into the sub-carriers or tones used for the OFDM or OFDMA symbols and packets/frames. Typically, the frequency responses of these sub-carriers are non-overlapping and orthogonal. Each sub-carrier may be modulated using any of a variety of modulation coding techniques (e.g., as shown by the vertical axis of modulated data).

In an example of operation, a communication device performs encoding of one or more bits to generate one or more coded bits used to generate the modulation data (or generally, data). For example, a processor of a communication device performs forward error correction (FEC) and/or error correction code (ECC) of one or more bits to generate one or more coded bits. Examples of FEC and/or ECC may include turbo code, convolutional code, turbo trellis coded modulation (TTCM), low density parity check (LDPC) code, Reed-Solomon (RS) code, BCH (Bose and Ray-Chaudhuri, and Hocquenghem) code, etc. The one or more coded bits may then undergo modulation or symbol mapping to generate modulation symbols. The modulation symbols may include data intended for one or more recipient devices. Note that such modulation symbols may be generated using any of various types of modulation coding techniques. Examples of such modulation coding techniques may include binary phase shift keying (BPSK), quadrature phase shift keying (QPSK), 8-phase shift keying (PSK), 16 quadrature amplitude modulation (QAM), 32 amplitude and phase shift keying (APSK), etc., uncoded modulation, and/or any other desired types of modulation including higher ordered modulations that may include even greater number of constellation points (e.g., 1024 QAM, etc.).

FIG. 4B is a diagram illustrating another example 402 of OFDM and/or OFDMA. A transmitting device transmits modulation symbols via the sub-carriers. OFDM and/or OFDMA modulation may operate by performing simultaneous transmission of a large number of narrowband carriers (or multi-tones). In some applications, a guard interval (GI) or guard space is sometimes employed between the various OFDM symbols to try to minimize the effects of ISI (Inter-Symbol Interference) that may be caused by the effects of multi-path within the communication system, which can be particularly of concern in wireless communication systems. In addition, a CP (Cyclic Prefix) and/or cyclic suffix (CS) (shown in right hand side of FIG. 4A) that may be a copy of the CP may also be employed within the guard interval to allow switching time, such as when jumping to a new communication channel or sub-channel, and to help maintain orthogonality of the OFDM and/or OFDMA symbols. Generally speaking, an OFDM and/or OFDMA system design is based on the expected delay spread within the communication system (e.g., the expected delay spread of the communication channel).

In a single-user system in which one or more OFDM symbols or OFDM packets/frames are transmitted between a transmitter device and a receiver device, all of the sub-carriers or tones are dedicated for use in transmitting modulated data between the transmitter and receiver devices. In a multiple user system in which one or more OFDM symbols or OFDM packets/frames are transmitted between a transmitter device and multiple recipient or receiver devices, the various sub-carriers or tones may be mapped to different respective receiver devices as described below with respect to FIG. 4C.

FIG. 4C is a diagram illustrating another example 403 of OFDM and/or OFDMA. Comparing OFDMA to OFDM, OFDMA is a multi-user version of the popular orthogonal frequency division multiplexing (OFDM) digital modulation scheme. Multiple access is achieved in OFDMA by assigning subsets of subcarriers to individual recipient devices or users. For example, first sub-carrier(s)/tone(s) may be assigned to a user 1, second sub-carrier(s)/tone(s) may be assigned to a user 2, and so on up to any desired number of users. In addition, such sub-carrier/tone assignment may be dynamic among different respective transmissions (e.g., a first assignment for a first packet/frame, a second assignment for second packet/frame, etc.). An OFDM packet/frame may include more than one OFDM symbol. Similarly, an OFDMA packet/frame may include more than one OFDMA symbol. In addition, such sub-carrier/tone assignment may be dynamic among different respective symbols within a given packet/frame or super-frame (e.g., a first assignment for a first OFDMA symbol within a packet/frame, a second assignment for a second OFDMA symbol within the packet/frame, etc.). Generally speaking, an OFDMA symbol is a particular type of OFDM symbol, and general reference to OFDM symbol herein includes both OFDM and OFDMA symbols (and general reference to OFDM packet/frame herein includes both OFDM and OFDMA packets/frames, and vice versa). FIG. 4C shows example 403 where the assignments of sub-carriers to different users are intermingled among one another (e.g., sub-carriers assigned to a first user includes non-adjacent sub-carriers and at least one sub-carrier assigned to a second user is located in between two sub-carriers assigned to the first user). The different groups of sub-carriers associated with each user may be viewed as being respective channels of a plurality of channels that compose all of the available sub-carriers for OFDM signaling.

FIG. 4D is a diagram illustrating another example 404 of OFDM and/or OFDMA. In this example 404, the assignments of sub-carriers to different users are located in different groups of adjacent sub-carriers (e.g., first sub-carriers assigned to a first user include first adjacently located sub-carrier group, second sub-carriers assigned to a second user include second adjacently located sub-carrier group, etc.). The different groups of adjacently located sub-carriers associated with each user may be viewed as being respective channels of a plurality of channels that compose all of the available sub-carriers for OFDM signaling.

A wireless communication device may be implemented to include a processor that generates an OFDMA packet based on a selected OFDMA packet structure that complies with the general format of an OFDMA packet or packet/frame as described herein. Again, note that any type of data may be modulated and included in the sub-carriers of an OFDM symbol generated by communication device. For example, this information may include Next Codeword Pointer (NCP) information, data (e.g., including forward error correction (FEC) and/or error correction code (ECC) generated codewords), and/or any other type(s) of information may be included within such an OFDM symbol.

Figures 5A, 5B:
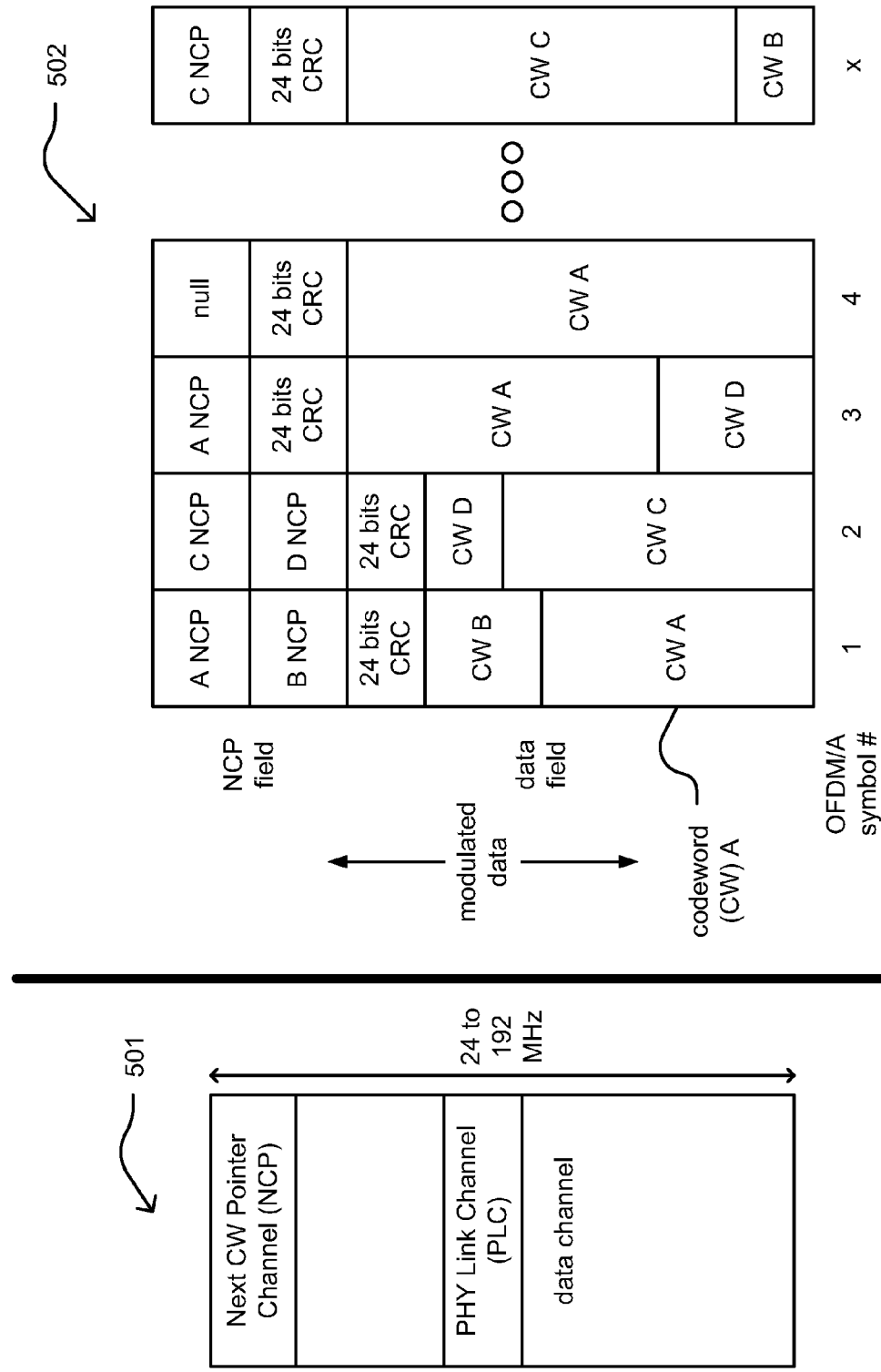
FIG. 5A is a diagram illustrating an example of an orthogonal frequency division multiplexing (OFDM) channel with physical layer (PHY) Link Channel (PLC).
FIG. 5B is a diagram illustrating an example of OFDM or OFDMA symbols that include Next Codeword Pointer (NCP) message blocks.

FIG. 5A is a diagram illustrating an example 501 of an orthogonal frequency division multiplexing (OFDM) channel with physical layer (PHY) Link Channel (PLC). The PHY Link Channel (PLC) relative to the OFDM channel is shown in this diagram. The PHY Link Channel (PLC) is located in the downstream convergence layer. It may be used for several tasks including the following:
  1. Timestamp.
  2. Energy management.
  3. Message channel for bringing new cable modems (CMs) on line.
  4. Trigger message for synchronizing an event between the CMTS and CM.

The CMTS may operate to assign a unique PLC to each OFDM channel. If there is more than one OFDM channel, the CM will be directed as to which PLC will be the primary PLC for the CM. When the CM initializes, it first locates a PLC channel. It then acquires just enough configuration information to join a primary downstream profile in the main OFDM channel. From there, it receives further configuration information. Certain preferred radio frequency (RF) parameters and cyclic redundancy check (CRC) (e.g., CRC-24-D) may be employed.

The Next Codeword Pointer (NCP) channel is used and added to downstream OFDM symbols to point to the codewords being transmitted (e.g., one pointer per codeword). The NCPs and data subcarriers may be time and/or frequency interleaved together, and one OFDM symbol may incorporate more than one NCP (e.g., several NCPs). A successful decoding of an FEC codeword relies on a proper reception and decoding of its associated NCP. As such, the NCP FEC is designed to provide good immunity against noise (additive white Gaussian noise (AWGN) and burst noise) and should generally have error correction capability at least as good as the FEC used for the data channel FIG. 5B is a diagram illustrating an example 502 of OFDM or OFDMA symbols that include Next Codeword Pointer (NCP) message blocks. In this diagram, a number of OFDM or OFDMA symbols include NCP message blocks (e.g., shown as A NCP, B NCP, etc.) as well as various codewords (e.g., codeword (CW) A, CW B, CW C, etc.). The OFDM or OFDMA symbols (x shown in this diagram) may be arranged in an OFDM or OFDMA frame, packet, etc. The one or more coded NCPs and the coded NCP CRC bits are mapped to sub-carriers according to a preferred ordering (e.g., starting with a top of the frequency spectrum of allocated sub-carriers and then down to lower frequency sub-carriers). In this example 502, CW A starts at the beginning of the OFDM/OFDMA symbol 1 and has a NCP start pointer (e.g., A NCP). CW B starts after CW A also has a respective NCP start pointer (e.g., B NCP). Note that the length/size of the CW B is different than CW A. The length of CW A is the difference between the A NCP for CW A and the B NCP for CW B.

Also, in this example 502, CW C starts at the beginning of the OFDM/OFDMA symbol 2 and has a NCP start pointer (e.g., C NCP). The length of the previous CW B is determined based on the difference between the B NCP for CW B and C NCP for CW C. D NCP for CODEWORD D also starts in OFDM/OFDMA symbol 2.

In OFDM/OFDMA symbol 3, CW D continues from OFDM/OFDMA symbol 2 and finishes. CW A follows and is given a start pointer A NCP for CW A. The length of CW D is determined based on the difference between the NCP for C NCP for CW C and the D NCP for CW D. Additional arrangement of OFDM/OFDMA symbols may be understood similarly based on the arrangement of OFDM/OFDMA symbols 1-3. Note that FIG. 5B shows just one possible arrangement of OFDM/OFDMA symbols that include coded NCPs and coded NCP CRC bits. A receiver communication device processes such OFDM/OFDMA symbols to extract such NCP related information to identify the location of the beginnings of the codewords within the same OFDM/OFDMA symbols or subsequent OFDM/OFDMA symbols.

Again, note that any type of data may be modulated and included in the sub-carriers of an OFDM symbol generated by communication device, and one example of such data may include Next Codeword Pointer (NCP) information as described herein.

FIG. 6A is a diagram illustrating an example 601 of a two dimensional (2D) array used for interleaving of OFDM sub-carriers. The interleaving of OFDM sub-carriers operates by writing sub-carriers (e.g., shown as sub-carriers 1 through N in this diagram) to rows of a two dimensional (2D) array and reading the sub-carriers from columns of the 2D array. This interleaving operates to read a column of the columns, for all columns excluding a last column of the 2D array, using a bit-reversed address of the column when the bit-reversed address is less than a number of the columns of the 2D array and also operates by using the address of the column when the bit-reversed address is greater than or equal to the number of the columns.

Bit reverse processing may be performed as follows. A number's representation in binary (e.g., in a 7 bit binary system, where 1 is represented as 0000001, 2 is represented as 0000010, and so on up to where 64 represented as 1000000) is reversed in terms of the least significant bit (LSB) becomes the most significant bit (MSB) such that the umber's representation in binary is reversed. Some examples are provided below:

bit reversal of 0000001 (1) becomes 1000000 (64)
bit reversal of 0000010 (2) becomes 0100000 (32)
bit reversal of 0000011 (3) becomes 1100000 (96)
. . .
bit reversal of 1000000 (64) becomes 0000001 (1).

A conditional or selective bit-reverse process may be performed as follows:

If the bit-reversed result is outside of a certain range (e.g., consider the range limit as being 64), and when the bit-reversed result is less than 64, the bit-reversed result is used. Alternatively when then when the bit-reversed result is greater than or equal to 64, then the original or non-bit-reversed result is used. Some examples are provided below:

bit reversal of 0000001 (1) becomes 1000000 (64), which is equal to the range limit, so the original or non-bit-reversed result is used: 0000001 (1) is used bit reversal of 0000010 (2) becomes 0100000 (32), which is less than the range limit, so the bit-reversed result is used: 0100000 (32) is used bit reversal of 0000011 (3) becomes 1100000 (96), which is greater than the range limit, so the original or non-bit-reversed result is used: 0000011 (3) is used

. . .

bit reversal of 1000000 (64) becomes 0000001 (1), which is less than the range limit, so the bit-reversed result is used: 0100000 (32) is used.

When reading a column value from the 2D array, the address of the column (e.g., sub-carrier number read from the column) undergoes selective or conditional bit reversing. When the resulting bit-reversed address of the column is less than a total number of columns of the 2D array, then the resulting bit-reversed address of the column is used. Alternatively, when the resulting bit-reversed address of the column is greater than or equal to the total number of columns of the 2D array, then the actual (i.e., not the bit-reversed) address of the column is used. This is selective or conditional bit-reversed addressing of the sub-carriers when reading from the columns of the 2D array.

For example, consider that the 2D array includes X rows and Y columns. When the resulting bit-reversed address of the column is less than a total number of columns, Y, of the 2D array, then the resulting bit-reversed address of the column is used. Alternatively, when the resulting bit-reversed address of the column is greater than or equal to the total number of columns of the 2D array, Y, then the actual (i.e., not the bit-reversed) address of the column is used. This is selective or conditional bit-reversed addressing of the sub-carriers when reading from the columns of the 2D array.

Note also that there may be situations where the total number of sub-carriers that undergo interleaving using the 2D array do not fully fill the entire 2D array (e.g., consider that the 2D array includes X rows and Y columns, then X×Y is greater than the total number of sub-carriers, N, such that N<X×Y). As such, there may be instances where a portion of the lower right hand portion of the 2D array remains empty or vacant. For example, one or more rows may be missing elements in the last column of the 2D array (or alternatively, the bottom one or more elements of the last column of the 2D array may be empty or vacant). As such, the last column may have fewer elements than the other columns of the 2D array, with the empty or vacant locations in the lower portion of the column if writing row by row to the 2D array starts from the top row (alternatively, with the empty or vacant locations in the upper portion of the column if writing row by row to the 2D array starts from the bottom row). The selective or conditional bit-reversal will deal with this possible situation.

This disclosure presents novel frequency interleaving (and/or de-interleaving) that may be used in any of a number of various communication systems. One specific example of such frequency interleaving (and/or de-interleaving) may be related to performing downstream communication within communication systems that are compliant with certain communication standard, protocols, and/or recommended practices (e.g., including the developing DOCSIS 3.1). This novel frequency interleaving operates by reading columns out in bit-reverse order that is selective or conditional dependent on the value of the bit-reversed address when compared to the number of columns of the 2D array.

An example of such frequency interleaving (and/or de-interleaving) is provided below such that columns are read out from the 2D array using selective or conditional bit-reverse order.

Let N be the total number of sub-carriers
Use a two-dimensional store (2D array) with 128 rows and K=ceiling(N/128) columns (e.g., 2D array has size 128 rows×K column)
Rows are accessed in bit-reverse order
Data are written consecutively into the store, row-by-row
Columns 0 to (K−2) undergo rotation
Columns are read out in bit-reverse order, starting at column 0, then column bit-reverse(1), then column bit-reverse(2), . . . , ending at column bit-reverse(K−1)
When K is not a power-of-2, bit-reverse(x), for x=0, . . . , K−1, is defined by:
bit-reverse(x)=reverse_bits(x), if reverse_bits(x)<K; OR
x, if reverse_bits(x)>=K
where reverse_bits(x) is the number obtained by reversing the order of the bits in the m-bit representation of x, with m being the number of bits in K.

Note that an alternative implementation may be performed to perform frequency interleaving by writing data in each row using selective or conditional bit-reverse order.

Let N be the total number of sub-carriers
Use a two-dimensional store with 128 rows and K=ceiling(N/128) columns
Rows are accessed in bit-reverse order
Data within each row are written in bit-reverse order
Columns 0 to (K−2) undergo rotation
Columns are read out beginning from column 0 and ending in column K−1 in sequential order
When operating according to this example:
Before: when there are 30 columns, Row 0 is as follows:
0 1 2 3 4 5 6 7 8 9 10 11 12 13 14 15 16 17 18 19 20 21 22 23 24 25 26 27 28 29
Now: when there are 30 columns, Row 0 is as follows:
0 16 8 24 4 20 12 28 2 18 10 26 6 22 14 15 1 17 9 25 5 21 13 29 3 19 11 27 7 23

FIG. 6B is a diagram illustrating another example 602 of a 2D array used for interleaving of OFDM sub-carriers. This disclosure also presents another scheme of performing frequency interleaving that may be used in any of a number of various communication systems (e.g., including communication systems that are compliant with the developing DOCSIS 3.1). This diagram shows a 2D array of size 48 (e.g., 12×4 2D array rectangular interleaver with 12 rows and 4 columns). Consider 48 sub-carriers (e.g., number $a_0 a_1 a_2 \ldots a_{47}$) that undergo interleaving using this 12×4 2D array, the sub-carriers are written row by row into the 2D array (e.g., $a_0$ to top row/$1^{st}$ column, $a_1$ to second to top row/$1^{st}$ column and so on downward until is $a_{11}$ written to the bottom row/$1^{st}$ column, and then starting at the top row again where $a_{12}$ written to the bottom row/$2^{nd}$ column, and so on until the $48^{th}$ sub-carrier is written to the last entry within the 12×4 2D array, namely, the bottom row/$4^{th}$ column). Note that 4 sub-carriers are written to each row in the 12×4 2D array, and 12 sub-carriers are written to each column in the 12×4 2D array.

In the read process from the 2D array, sub-carriers are read as a function of columns. For example, the element $a_0$ is read from the top row/$1^{st}$ column, then the element $a_{12}$ is read from the top row/$2^{nd}$ column, then element $a_{24}$ is read from the top row/$3^{rd}$ column, then the element $a_{36}$ is read from the top row/$4^{th}$ column. After all elements from the top row are read, the column read process continues by reading from the second to top row: the element $a_1$ is read from the $2^{nd}$ to top row/$1^{st}$ column, then the element $a_{13}$ is read from the $2^{nd}$ to top row/$2^{nd}$ column, then element $a_{25}$ is read from the $2^{nd}$ to top row/$3^{rd}$ column, then the element $a_{37}$ is read from the $2^{nd}$ to top row/$4^{th}$ column. This process continues until all columns have been read.

For this example of 4 columns, the selective or conditional bit-reversed address of the column read process may be performed as follows:

Columns are read out in bit-reverse order, starting at column 0, then column bit-reverse(1), then column bit-reverse(2), . . . , ending at column bit-reverse(3)
Then, the bit-reverse(x), for x=0, . . . , K−1=3, is defined by:
bit-reverse(x)=reverse_bits(x), if reverse_bits(x)<K=4; OR
x, if reverse_bits(x)>=K=4
where reverse_bits(x) is the number obtained by reversing the order of the bits in the m-bit representation of x, with m being the number of bits in K.

FIG. 6C is a diagram illustrating an example 603 of different 2D arrays used at different times for interleaving of OFDM sub-carriers. This diagram shows how different sized 2D arrays may be used at different times to interleave different numbers of sub-carriers. At or during a first time (time 1), N sub-carriers (i.e., sub-carriers 1 through N) undergo interleaving using a first 2D array (e.g., writing to the first 2D array row by row and reading from all columns, excluding for a last column of the first 2D array, using a selective or conditional bit-reversed address scheme as presented herein) to generate interleaved sub-carriers 1' through N' (e.g., of a first interleaved OFDM symbol). Then, at or during a second time (time 2), M sub-carriers (i.e., sub-carriers 1 through M) undergo interleaving using a second 2D array (e.g., writing to the second 2D array row by row and reading from all columns, excluding for a last column of the second 2D array, using a selective or conditional bit-reversed address scheme as presented herein) to generate interleaved sub-carriers 1' through M' (e.g., of a second interleaved OFDM symbol). Within each of the first and second 2D array examples in this diagram, there may be instances where fewer than all elements of the last column are included (i.e., some elements in the last column may be empty or vacant, such as when N or M is less than the total size/number of elements of the first or second 2D array).

Figure 7A:
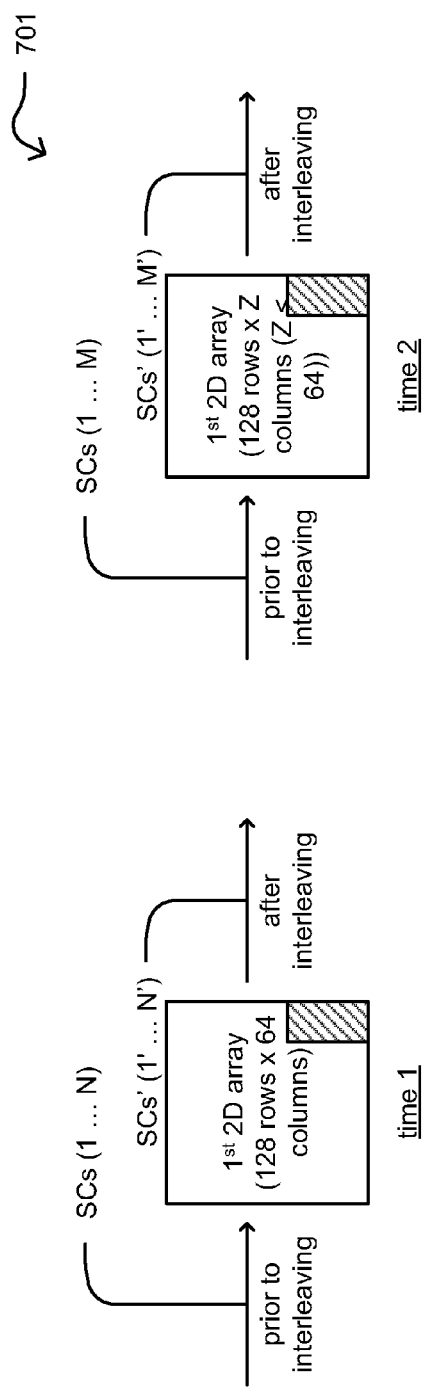
FIG. 7A is a diagram illustrating another example of different 2D arrays used at different times for interleaving of OFDM sub-carriers.

FIG. 7A is a diagram illustrating another example 701 of different 2D arrays used at different times for interleaving of OFDM sub-carriers. This diagram shows an example of a 2D array that includes a fixed number, N, of rows and a variable number of columns, Z, at different times, which may depend on the total number of sub-carriers being interleaved (where N and Z are integers).

In this diagram, at or during a first time (time 1), N sub-carriers (i.e., sub-carriers 1 through N) undergo interleaving using a first 2D array that includes N=128 rows×Z=64 columns (e.g., writing to the first 2D array row by row and reading from all columns, excluding for a last column, i.e., the $64^{th}$ column, of the first 2D array, using a selective or conditional bit-reversed address scheme as presented herein) to generate interleaved sub-carriers 1' through N' (e.g., of a first interleaved OFDM symbol).

Then, at or during a second time (time 2), M sub-carriers (i.e., sub-carriers 1 through M) undergo interleaving using a second 2D array that includes N=128 rows×Z columns (where Z is a number less than 64) (e.g., writing to the second 2D array row by row and reading from all columns, excluding for a last column of the second 2D array, using a selective or conditional bit-reversed address scheme as presented herein) to generate interleaved sub-carriers 1' through M' (e.g., of a second interleaved OFDM symbol). Within each of the first and second 2D array examples in this diagram, there may be instances where fewer than all elements of the last column are included (i.e., some elements in the last column may be empty or vacant, such as when N or M is less than the total size/number of elements of the first or second 2D array).

Figure 7B:
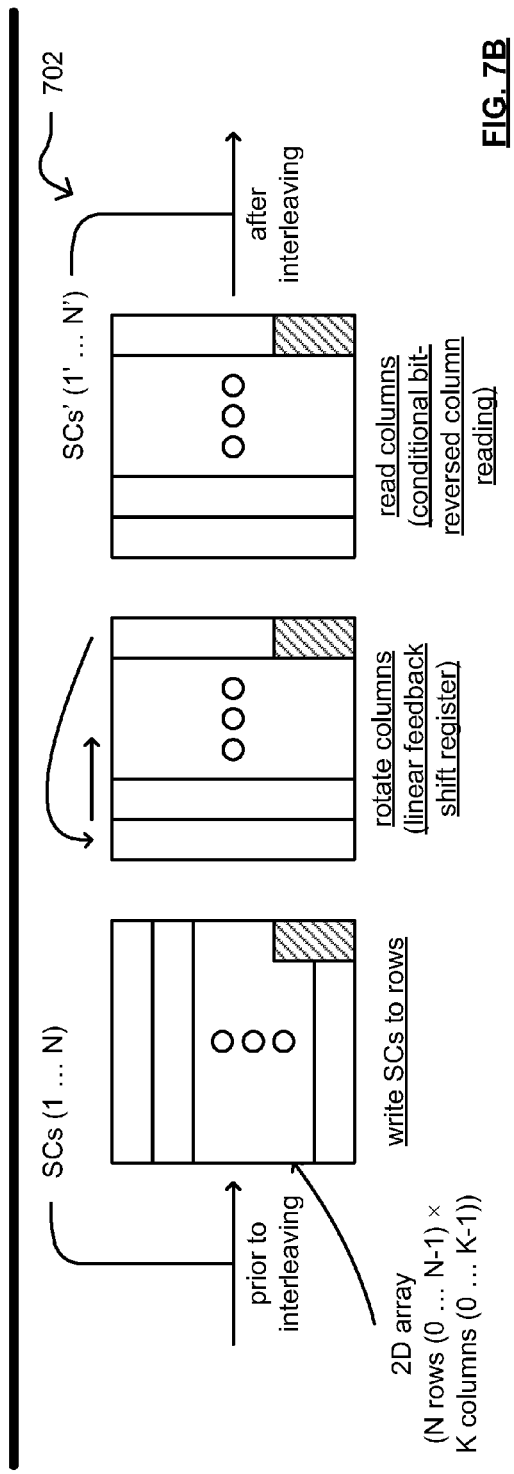
FIG. 7B is a diagram illustrating an example of a 2D array used for interleaving of OFDM sub-carriers.

FIG. 7B is a diagram illustrating an example 702 of a 2D array used for interleaving of OFDM sub-carriers. In this diagram for example 702, the frequency interleaver works on individual OFDM symbols. Each symbol to be interleaved consists of $N_I$ subcarriers. These $N_I$ subcarriers are made up of $N_D$ data subcarriers and $N_S$ scattered pilot placeholders. Although $N_D$ and $N_S$ are not the same for every symbol, the value of $N_I$ is a constant for all OFDM symbols in a given system configuration.

There is a 2-D store (2D array) comprising 128 rows and K columns. If the number of data subcarriers and scattered pilots in the OFDM symbol is $N_I$, then the number of columns, K, is given by the following equation:

$$K = \mathrm{ceil}(N_I/128), \text{ where ceil is the ceiling function.}$$

If $N_I$ is not an integer multiple of 128, then the last column will only be partially filled during the frequency interleaving process. The number of data subcarriers in the last column, C, is given by:

$$C = N_I - 128(K-1)$$

The frequency interleaver follows the following process using a 2D array that includes N rows and K columns (e.g., where N=128 in this example, and K may be any desired integer number and differently valued at different times when interleaving different sub-carriers); note that rows are numbered 0 to N−1, and columns are numbered from 0 to (K−1):

1. Write the subcarriers along rows of the 2-D store. Rows are accessed in bit-reversed order. For example, after writing in row 0, the next writing operation will be in row 64. This will be followed by writing in row 32 and so on. If the row number is less than C, then K subcarriers will be written in the row. Otherwise only (K−1) subcarriers will be written. (If the number NI is an integer multiple of 128 then C will be zero. Then K subcarriers will be written in every row.)

2. Rotate columns 0 to (K−2) by an amount given by a 6-bit shift linear feedback (maximal length) shift register. This shift register is initialized to a value of 17 at the start of each OFDM symbol. The final column, which may be partially full, is not rotated.

3. Read the columns in bit-reverse order, starting at column 0, then column bit-reverse(1), then column bitreverse(2), ..., ending at column bit-reverse(K−1). When K is not a power-of-2, bit-reverse(x), for x=0, ..., K−1, is defined by:
bit-reverse(x)=reverse_bits(x), if reverse_bits(x)<K; OR
x, if reverse_bits(x)≥K where reverse_bits(x) is the number obtained by reversing the order of the bits in the m-bit representation of x, with m being the number of bits in K.

FIG. 8A is a diagram illustrating an embodiment of a method 801 for execution by one or more communication devices. The method 801 begins by generating an orthogonal frequency division multiplexing (OFDM) symbol that includes information modulated within a plurality of sub-carriers (block 810). The method 801 continues by interleaving the plurality of sub-carriers of the OFDM symbol to generate an interleaved OFDM symbol (block 820). This may be viewed as performing frequency domain (FDOM) or sub-carrier based interleaving in that the sub-carriers are interleaved.

The method 801 then operates by writing the plurality of sub-carriers to rows of a two dimensional (2D) array and reading the plurality of sub-carriers from columns of the 2D array with a selective or conditional column reading process (block 822). The method 801 then operates by transmitting the interleaved OFDM symbol to another communication device (e.g., transmitting, via a communication interface of the communication device, the interleaved OFDM symbol to another communication device) (block 830).

FIG. 8B is a diagram illustrating another embodiment of a method 802 for execution by one or more communication devices. The method 802 begins by receiving at least one symbol (OFDM or OFDMA) that includes information modulated within sub-carriers (block 811). The method 802 continues by de-interleaving the sub-carriers (frequency domain (FDOM) or SC interleaving) (block 821). The method 802 may also operate by performing de-interleaving using a reverse operation of interleaving that operates by performing writing/reading into 2D array with conditional bit-reversed column reading (block 823). The method 802 then operates by processing de-interleaved at least one symbol to estimate information modulated sub-carriers (block 831).

Also, note that such bit-reversal related operations as described herein may be adapted and applied to different operations performed within a communication device. For example, a processor of a communication device performs encoding (e.g., using a forward error correction (FEC) and/or error correction code (ECC) of any of various types such as turbo code, convolutional code, turbo trellis coded modulation (TTCM), low density parity check (LDPC) code, Reed-Solomon (RS) code, BCH (Bose and Ray-Chaudhuri, and Hocquenghem) code, etc.) to generate codewords, a sequence or stream of coded bits, coded bits, etc. that can subsequently undergo symbol mapping or modulation such that the bits of the codewords, a sequence or stream of coded bits, coded bits, etc. are assigned to discrete-valued modulation symbols that get assigned to constellation points within one or more constellations.

For example, an encoder (e.g., such as an LDPC encoder) outputs a stream of 48 bits (e.g., with $a_0$ as the first bit) as follows: $\{b_{143}\ b_{142}\ \ldots\ b_{128}\ b_{111}\ b_{110}\ \ldots\ b_{104}\ a_{23}\ a_{22}\ \ldots\ a_0\}$ For one example of quadrature amplitude modulation (QAM)-64, the processor maps the bits into eight 6-bit QAM constellation points as follows:

$$\{y_{0,0} y_{0,1} y_{0,2} y_{0,3} y_{0,4} y_{0,5}\} = \{a_0 a_1 a_2 a_3 a_4 a_5\}$$

$$\{y_{1,0} y_{1,1} y_{1,2} y_{1,3} y_{1,4} y_{1,5}\} = \{a_6 a_7 a_8 a_9 a_{10} a_{11}\}$$

...

$$\{y_{7,0} y_{7,1} y_{7,2} y_{7,3} y_{7,4} y_{7,5}\} = \{b_{138} b_{139} b_{140} b_{141} b_{142} b_{143}\}$$

The processor maps each 6-bit integer $\{y_{i,0}\ y_{i,1}\ y_{i,2}\ y_{i,3}\ y_{i,4}\ y_{i,5}\}$ to a constellation point (e.g., such as prescribed by the 64-QAM Constellation Mapping in one or more communication protocols, recommended practices, and/or standard including the developing DOCSIS 3.1).

Alternatively, in another example, the processor performs bit-reversal on the bits for each constellation point just prior to mapping. For example, a processor of a communication device performs encoding to generate codewords, a sequence or stream of coded bits, coded bits, etc. that can subsequently undergo symbol mapping or modulation such that the bits of the codewords, a sequence or stream of coded bits, coded bits, etc. are assigned to discrete-valued modulation symbols that get assigned to constellation points within one or more constellations.

For example, an encoder (e.g., such as an LDPC encoder) outputs a stream of 48 bits (with $a_0$ as the first bit) as follows: $\{b_{143}\ b_{142}\ \ldots\ b_{128}\ b_{111}\ b_{110}\ \ldots\ b_{104}\ a_{23}\ a_{22}\ \ldots\ a_0\}$ For QAM-64, the encoded bits are mapped into eight 6-bit QAM constellation points as For another example of quadrature amplitude modulation (QAM)-64, the processor maps the bits into eight 6-bit QAM constellation points as follows:

$$\{y_{0,0} y_{0,1} y_{0,2} y_{0,3} y_{0,4} y_{0,5}\} =$$
$$\text{bit reverse of}[\{a_0 a_1 a_2 a_3 a_4 a_5\}] \to \{a_5 a_4 a_3 a_2 a_1 a_0\}$$

$$\{y_{1,0} y_{1,1} y_{1,2} y_{1,3} y_{1,4} y_{1,5}\} =$$
$$\text{bit reverse of}[\{a_6 a_7 a_8 a_9 a_{10} a_{11}\}] \to \{a_{11} a_{10} a_9 a_8 a_7 a_6\}$$

...

$$\{y_{7,0} y_{7,1} y_{7,2} y_{7,3} y_{7,4} y_{7,5}\} =$$
$$\text{bit reverse of}[\{b_{138} b_{139} b_{140} b_{141} b_{142} b_{143}\}] \to \{b_{143} b_{142} b_{141} b_{140} b_{139} b_{138}\}$$

Note that $\{a_5\ a_4\ a_3\ a_2\ a_1\ a_0\}$ is a bit-reversed version of $\{a_0\ a_1\ a_2\ a_3\ a_4\ a_5\}$.

Note that $\{a_{11}\ a_{10}\ a_9\ a_8\ a_7\ a_6\}$ is a bit-reversed version of $\{a_6\ a_7\ a_8\ a_9\ a_{10}\ a_{11}\}$.

...

Note that $\{b_{143}\ b_{142}\ b_{141}\ b_{140}\ b_{139}\ b_{138}\}$ is a bit-reversed version of $\{b_{138}\ b_{139}\ b_{140}\ b_{141}\ b_{142}\ b_{143}\}$.

In this example, the processor performs bit-reversal of the bits before they undergo symbol mapping or modulation.

The processor maps each 6-bit integer $\{y_{i,0}\ y_{i,1}\ y_{i,2}\ y_{i,3}\ y_{i,4}\ y_{i,5}\}$ to a constellation point (e.g., such as prescribed by the 64-QAM Constellation Mapping in one or more communication protocols, recommended practices, and/or standard including the developing DOCSIS 3.1).

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to," "operably coupled to," "coupled to," and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to," "operable to," "coupled to," or "operably coupled to" indicates that an item includes one or more of power connections, input(s), output(s), etc., to perform, when activated, one or more its corresponding functions and may further include inferred coupling to one or more other items. As may still further be used herein, the term "associated with," includes direct and/or indirect coupling of separate items and/or one item being embedded within another item.

As may be used herein, the term "compares favorably" or equivalent, indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module," "processing circuit," "processor," and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments of an invention have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples of the invention. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure of an invention is not limited by the particular examples disclosed herein and expressly incorporates these other combinations.

What is claimed is:

1. A communication device comprising:
    a communication interface; and
    a processor configured to:
        generate an orthogonal frequency division multiplexing (OFDM) symbol that includes information modulated within a plurality of sub-carriers;
        interleave the plurality of sub-carriers of the OFDM symbol to generate an interleaved OFDM symbol, wherein the interleave of the plurality of sub-carriers operates to write the plurality of sub-carriers to rows of a two dimensional (2D) array and read the plurality of sub-carriers from columns of the 2D array, wherein the interleave operates, for all columns excluding a last column of the 2D array, to read a column of the columns using a bit-reversed address of the column when the bit-reversed address is less than a number of the columns and using the address of the column when the bit-reversed address is greater than or equal to the number of the columns; and
        transmit, via the communication interface, the interleaved OFDM symbol to another communication device.

2. The communication device of claim 1, wherein the processor is further configured to:
    generate another OFDM symbol that includes other information modulated within another plurality of sub-carriers; and
    interleave the other plurality of sub-carriers of the other OFDM symbol to generate another interleaved OFDM symbol, wherein the interleave of the other plurality of sub-carriers operates to write the other plurality of sub-carriers to rows of another 2D array and read the other plurality of sub-carriers from columns of the other 2D array, wherein the 2D array includes a number of the rows and the number of the columns and the other 2D array includes the number of the rows and another number of columns that is different than the number of the columns.

3. The communication device of claim 1, wherein the processor is further configured to:
    write the plurality of sub-carriers to rows of the 2D array consecutively and row by row; and
    rotate a subset of the columns of the 2D array that excludes the last column of the 2D array before reading the plurality of sub-carriers from the columns of the 2D array.

4. The communication device of claim 1, wherein the information modulated within the plurality of sub-carriers includes a Next Codeword Pointer (NCP) modulated within a first subset of the plurality of sub-carriers and data modulated within a second subset of the plurality of sub-carriers, wherein the NCP indicates beginning of a forward error correction (FEC) codeword within the OFDM symbol or another OFDM symbol.

5. The communication device of claim 4, wherein:
the plurality of sub-carriers includes 4096 sub-carriers based on a 50 kHz carrier spacing or 8192 sub-carriers based on a 25 kHz carrier spacing; and
the first subset of the plurality of sub-carriers includes an integer number of 8 sub-carriers that are contiguously located within and beginning at a highest sub-carrier of the 4096 or 8192 sub-carriers.

6. The communication device of claim 1, wherein the processor is further configured to:
generate an orthogonal frequency division multiple access (OFDMA) frame using the interleaved OFDM symbol and another interleaved OFDM symbol, wherein the OFDMA frame includes first data for the other communication device and second data for at least one other communication device; and
transmit, via the communication interface, the OFDMA frame to both the other communication device and the at least one other communication device.

7. The communication device of claim 1 further comprising:
a cable headend transmitter or a cable modem termination system (CMTS), wherein the other communication device is a cable modem.

8. The communication device of claim 1 further comprising:
the communication interface configured to support communications within at least one of a satellite communication system, a wireless communication system, a wired communication system, a fiber-optic communication system, or a mobile communication system.

9. A communication device comprising:
a communication interface; and
a processor configured to:
generate an orthogonal frequency division multiplexing (OFDM) symbol that includes information modulated within a plurality of sub-carriers;
interleave the plurality of sub-carriers of the OFDM symbol to generate an interleaved OFDM symbol, wherein the interleave of the plurality of sub-carriers operates to:
write the plurality of sub-carriers to rows of a two dimensional (2D) array consecutively and row by row; and
rotate a subset of columns of the 2D array that excludes a last column of the 2D array;
read, for all columns excluding the last column of the 2D array, the plurality of sub-carriers from columns of the 2D array using a bit-reversed address of the column when the bit-reversed address is less than a number of the columns and using the address of the column when the bit-reversed address is greater than or equal to the number of the columns; and
generate an orthogonal frequency division multiple access (OFDMA) frame using the interleaved OFDM symbol and another interleaved OFDM symbol, wherein the OFDMA frame includes first data for the other communication device and second data for at least one other communication device; and
transmit, via the communication interface, the OFDMA frame to both the other communication device and the at least one other communication device.

10. The communication device of claim 9, wherein the processor is further configured to:
generate another OFDM symbol that includes other information modulated within another plurality of sub-carriers; and
interleave the other plurality of sub-carriers of the other OFDM symbol to generate the other interleaved OFDM symbol, wherein the interleave of the other plurality of sub-carriers operates to:
write the other plurality of sub-carriers to rows of another 2D array consecutively and row by row; and
rotate a subset of columns of the other 2D array that excludes the last column of the other 2D array; and
read the other plurality of sub-carriers from columns of the other 2D array using a bit-reversed address of the column of the other 2D array when the bit-reversed address is less than a number of the columns of the other 2D array and using the address of the column of the other 2D array when the bit-reversed address is greater than or equal to the number of the columns of the other 2D array, wherein the 2D array and the other 2D array both include a same number of rows, and wherein the 2D array includes a different number of columns than the other 2D array.

11. The communication device of claim 9, wherein the information modulated within the plurality of sub-carriers includes a Next Codeword Pointer (NCP) modulated within a first subset of the plurality of sub-carriers and data modulated within a second subset of the plurality of sub-carriers, wherein the NCP indicates beginning of a forward error correction (FEC) codeword within the OFDM symbol or another OFDM symbol.

12. The communication device of claim 9 further comprising:
a cable headend transmitter or a cable modem termination system (CMTS), wherein the other communication device is a cable modem.

13. The communication device of claim 9 further comprising:
the communication interface configured to support communications within at least one of a satellite communication system, a wireless communication system, a wired communication system, a fiber-optic communication system, or a mobile communication system.

14. A method for execution by a communication device, the method comprising:
generating an orthogonal frequency division multiplexing (OFDM) symbol that includes information modulated within a plurality of sub-carriers;
interleaving the plurality of sub-carriers of the OFDM symbol to generate an interleaved OFDM symbol, wherein the interleaving of the plurality of sub-carriers operates to write the plurality of sub-carriers to rows of a two dimensional (2D) array and read the plurality of sub-carriers from columns of the 2D array, wherein the interleaving operates, for all columns excluding a last column of the 2D array, to read a column of the columns using a bit-reversed address of the column when the bit-reversed address is less than a number of the columns and using the address of the column when the bit-reversed address is greater than or equal to the number of the columns; and
transmitting, via a communication interface of the communication device, the interleaved OFDM symbol to another communication device.

15. The method of claim 14 further comprising:
generating another OFDM symbol that includes other information modulated within another plurality of sub-carriers; and interleaving the other plurality of sub-carriers of the other OFDM symbol to generate another interleaved OFDM symbol, wherein the interleaving of the other plurality of sub-carriers operates to write the other plurality of sub-carriers to rows of another 2D array and read the other plurality of sub-carriers from columns of the other 2D array, wherein the 2D array includes a number of the rows and the number of the columns and the other 2D array includes the number of the rows and another number of columns that is different than the number of the columns.

16. The method of claim 14 further comprising:
writing the plurality of sub-carriers to rows of the 2D array consecutively and row by row; and
rotating a subset of the columns of the 2D array that excludes the last column of the 2D array before reading the plurality of sub-carriers from the columns of the 2D array.

17. The method of claim 14, wherein the information modulated within the plurality of sub-carriers includes a Next Codeword Pointer (NCP) modulated within a first subset of the plurality of sub-carriers and data modulated within a second subset of the plurality of sub-carriers, wherein the NCP indicates beginning of a forward error correction (FEC) codeword within the OFDM symbol or another OFDM symbol.

18. The method of claim 14 further comprising:
generating an orthogonal frequency division multiple access (OFDMA) frame using the interleaved OFDM symbol and another interleaved OFDM symbol, wherein the OFDMA frame includes first data for the other communication device and second data for at least one other communication device; and
transmitting, via the communication interface, the OFDMA frame to both the other communication device and the at least one other communication device.

19. The method of claim 14, wherein the communication device is a cable headend transmitter or a cable modem termination system (CMTS), and the other communication device is a cable modem.

20. The method of claim 14 further comprising:
operating the communication interface of the communication device to support communications within at least one of a satellite communication system, a wireless communication system, a wired communication system, a fiber-optic communication system, or a mobile communication system.

* * * * *